(12) United States Patent
Long et al.

(10) Patent No.: US 10,121,641 B2
(45) Date of Patent: Nov. 6, 2018

(54) LARGE DYNAMIC RANGE RF VOLTAGE SENSOR AND METHOD FOR VOLTAGE MODE RF BIAS APPLICATION OF PLASMA PROCESSING SYSTEMS

(71) Applicant: LAM RESEARCH CORPORATION, Fremont, CA (US)

(72) Inventors: Maolin Long, Santa Clara, CA (US); John Drewery, Santa Clara, CA (US); Alex Paterson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 521 days.

(21) Appl. No.: 14/728,444

(22) Filed: Jun. 2, 2015

(65) Prior Publication Data

US 2016/0358755 A1 Dec. 8, 2016

(51) Int. Cl.
*H01J 37/32* (2006.01)
*G01R 15/04* (2006.01)
(Continued)

(52) U.S. Cl.
CPC ........ *H01J 37/32183* (2013.01); *G01R 15/04* (2013.01); *G01R 15/26* (2013.01); *G01R 19/0084* (2013.01); *H01J 37/3299* (2013.01); *H01J 37/32155* (2013.01); *H01J 37/32577* (2013.01); *H01J 37/32706* (2013.01); *H01J 37/32715* (2013.01); *H01J 37/32935* (2013.01);
(Continued)

(58) Field of Classification Search
CPC .... G01R 15/04; G01R 15/26; G01R 19/0084; H01J 37/32155; H01J 37/32183; H01J 37/32706; H01J 37/32715; H01J 37/32935; H01J 37/3299; H01J 37/32577; H01J 2237/334; H01J 2237/332
See application file for complete search history.

(56) References Cited

U.S. PATENT DOCUMENTS 5,529,657 A 6/1996 Ishii
5,872,456 A 2/1999 Roderick et al.
(Continued)

FOREIGN PATENT DOCUMENTS

EP 1043593 B1 9/2002

OTHER PUBLICATIONS

Rogelio Palomera-Arias, "PIN Diode Switch Circuit for Short Time High Current Pulse Signal", May 22, 1998, 61 pages.

*Primary Examiner* — Yuechuan Yu (57) ABSTRACT

A voltage sensor of a substrate processing system including a multi-divider circuit, a clamping circuit and first and second outputs. The multi-divider circuit receives a RF signal indicative of a RF voltage at a substrate. The multi-divider circuit includes dividers of respective channels and outputting first and second reduced voltages based on the received RF signal. The reduced voltages are less than the RF voltage. The clamping circuit clamps the first reduced voltage to a first predetermined voltage when the RF voltage is greater than a second predetermined voltage or the first reduced voltage is greater than a third predetermined voltage. While the received RF signal is in first and second voltage ranges, the first and second outputs output output signals based respectively on the first and second reduced voltages. The first predetermined voltage is based on a maximum value of the first voltage range.

20 Claims, 5 Drawing Sheets

(51) Int. Cl.
    *G01R 15/26*    (2006.01)
    *G01R 19/00*    (2006.01)
(52) U.S. Cl.
    CPC ... *H01J 2237/332* (2013.01); *H01J 2237/334* (2013.01)

(56) References Cited

U.S. PATENT DOCUMENTS

| | | | |
|---|---|---|---|
| 5,955,793 | A | 9/1999 | Khadkikar et al. |
| 5,981,899 | A | 11/1999 | Perrin et al. |
| 5,990,668 | A * | 11/1999 | Coleman ............... H01J 37/34 323/271 |
| 6,198,616 | B1 | 3/2001 | Dahimene et al. |
| 6,281,469 | B1 | 8/2001 | Perrin et al. |
| 6,407,540 | B1 | 6/2002 | Shepherd |
| 6,563,076 | B1 | 5/2003 | Benjamin et al. |
| 7,393,433 | B2 | 7/2008 | Tanikunl et al. |
| 8,501,631 | B2 | 8/2013 | Valcore, Jr. et al. |
| 8,650,002 | B2 | 2/2014 | Choi et al. |
| 8,741,095 | B2 | 6/2014 | Koshimizu |
| 8,909,365 | B2 | 12/2014 | Valcore, Jr. |
| 2002/0094591 | A1* | 7/2002 | Sill ............... H01J 37/321 438/14 |
| 2002/0186018 | A1* | 12/2002 | Sill ............... H01J 37/321 324/463 |
| 2009/0159439 | A1* | 6/2009 | Pipitone ............... C23C 14/345 204/298.03 |
| 2010/0214710 | A1* | 8/2010 | Kora ............... G01R 19/0084 361/101 |

* cited by examiner

LARGE DYNAMIC RANGE RF VOLTAGE SENSOR AND METHOD FOR VOLTAGE MODE RF BIAS APPLICATION OF PLASMA PROCESSING SYSTEMS

CROSS-REFERENCE TO RELATED APPLICATIONS

The present disclosure is related to U.S. patent application Ser. No. 14/336,355, filed on Jul. 21, 2014. The entire disclosure of the application referenced above is incorporated herein by reference.

FIELD

The present disclosure relates to plasma processing systems and, more particularly, detecting RF voltages in an electrostatic chuck of a plasma processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Ionized gas, or plasma, is commonly used during the processing and fabrication of semiconductor devices. For example, plasma can be used to etch or remove material from a substrate such as a semiconductor wafer, and to deposit material onto the substrate by PVD or CVD. Creating plasma for use in manufacturing or fabrication processes typically begins by introducing process gases into a processing chamber. The substrate is disposed in the processing chamber on a substrate support structure such as an electrostatic chuck or a pedestal.

The processing chamber may include a transformer coupled plasma (TCP) source coil, which receives a radio frequency (RF) power supplied by an RF power generator. A dielectric window, constructed of a material such as ceramic, is incorporated into an upper surface of the processing chamber. The dielectric window allows the RF power from the TCP source coil to be transmitted into the interior of the processing chamber. The RF power excites gas molecules within the processing chamber to generate plasma.

The plasma includes electrons and charged particles. The electrons, being lighter than the charged particles, tend to migrate more readily, causing a sheath to form at surfaces of the processing chamber. A self-biasing effect causes a net negative charge at inner surfaces of the processing chamber. This net negative charge is provided relative to ground (referred to as a direct current (DC) bias) and relative to a potential of the plasma (referred to as DC sheath potential). The DC bias is a difference in electrical potential between a surface within the processing chamber and ground. The DC sheath potential is a difference between the potential of the surface within the processing chamber and the potential of the plasma. The DC sheath potential causes the heavier positively charged particles to be attracted towards the inner surfaces of the processing chamber. Strength of this DC sheath potential at the substrate largely determines the energy with which the positively charged particles strike the substrate. This energy affects process characteristics such as an etch rate or a deposition rate.

A bias RF power source supplies a biasing RF power to the substrate support structure. The biasing RF power can be used to increase the DC bias and/or the sheath potential to increase the energy with which the charged particles strike the substrate. Variations in the biasing RF power produce corresponding variations in the DC bias and/or sheath potential at the substrate affecting the process characteristics.

A voltage control interface (VCI) including a pickup device and a signal processing circuit may be used to detect a RF peak voltage at the substrate support structure. The pickup device may be attached to the substrate support structure and receives the RF peak voltage (i.e., RF bias voltage). The signal processing circuit is connected to the pickup device and converts the RF peak voltage into an analog signal that has a magnitude proportional to the peak value of the RF voltage under detection. When the bias RF system is operating on voltage mode, the biasing RF power is adjusted based on the detected RF peak voltage so that the bias RF voltage is regulated to its setpoint given in the process recipe.

A voltage sensor or pick-up device of a VCI may include a capacitive voltage divider for RF voltage detection on a corresponding channel. The VCI may include circuitry for signal conditioning and processing of a voltage signal received on the channel. The voltage sensor has a dynamic range that is typically limited to less than 40 db with reduced accuracy at low voltages. For example, the voltage sensor may have a dynamic range of 33.6 db from a 25 volt (V) peak to a 1200V peak with accuracy of t (1V+1.5% of a National Institute of Standards and Technology (NIST) reference value).

SUMMARY

A voltage sensor of a substrate processing system. The voltage sensor includes a multi-divider circuit, a clamping circuit, a first output, and a second output. The multi-divider circuit is configured to receive a radio frequency (RF) signal. The received RF signal is indicative of a RF voltage provided at a substrate in a plasma chamber of the substrate processing system. The multi-divider circuit includes a first divider and a second divider. The first divider corresponds to a first channel and outputs a first reduced voltage based on the received RF signal. The second divider corresponds to a second channel and outputs a second reduced voltage based on the received RF signal. The first reduced voltage and the second reduced voltage are less than the RF voltage. The clamping circuit is configured to clamp the first reduced voltage to a first predetermined voltage when (i) the RF voltage is greater than a second predetermined voltage, or (ii) the first reduced voltage is greater than a third predetermined voltage. The first output of the first channel is configured to output a first output signal based on the first reduced voltage and while the received RF signal is in a first voltage range and a second voltage range. The second voltage range is higher than the first voltage range. The first predetermined voltage is based on a maximum value of the first voltage range. The second output of the second channel is configured to output a second output signal based on the second reduced voltage and while the received RF signal is in the first voltage range and the second voltage range.

In other features, a method of operating a voltage sensor of a plasma processing system is provided. The method includes receiving a radio frequency (RF) signal at a first divider and at a second divider. The voltage sensor includes the first divider and the second divider. The first divider corresponds to a first channel. The second divider corresponds to a second channel. The received RF signal is indicative of a RF voltage provided at a substrate in a plasma chamber of the plasma processing system. The method further includes: generating a first reduced voltage via the first divider based on the received RF signal; generating a second reduced voltage via the second divider based on the received RF signal, where the first reduced voltage and the second reduced voltage are less than the RF voltage; and clamping the first reduced voltage to a first predetermined voltage when (i) the RF voltage is greater than a second predetermined voltage, or (ii) the first reduced voltage is greater than a third predetermined voltage. The method further includes: providing at a first output signal via the first channel based on the first reduced voltage and while the received RF signal is in a first voltage range and a second voltage range, where the second voltage range is higher than the first voltage range, and where the first predetermined voltage is based on a maximum value of the first voltage range; and providing a second output signal via the second channel based on the second reduced voltage and while the received RF signal is in the first voltage range and the second voltage range.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Higher and higher bias RF voltages are required for certain substrate processes. For example, high voltage bias pulsing (HVBP) may require that a voltage sensor of a VCI be capable of detecting peak voltages up to 2500V. A voltage sensor that includes a single voltage divider per channel has limited accuracy at low voltages. This becomes more evident the larger the peak voltage. To overcome this limitation, a voltage sensor may include multiple measurement channels, such that a first channel is used to measure voltages in a first (or low) range and a second voltage measurement channel is used to measure voltages in a second (or high) range. An output of a single voltage divider may be provided to each of the measurement channels, where each of the measurement channels has a respective signal processing circuit. Although the channels may be used to detect respective voltage ranges, the channel designed to detect low range voltages can be overloaded and/or damaged when high range voltages are detected.

To solve the overloading issue, a switching circuit may be added to the first channel used to detect the low range voltages. The switching circuit may turn ON or OFF the first channel. The switching circuit may include a diode (e.g., a pin diode) that receives an output of the voltage divider and may be activated via a direct current (DC) bias voltage. The DC bias voltage may be provided via a controller, which activates the diode based on whether RF voltages are in the low voltage range or the high voltage range. The diode is deactivated while high voltages are detected to protect a remainder of the channel designed for detecting the low range voltages.

A drawback to using the switching circuit design is that a controller is needed to generate DC bias voltage to power ON and OFF the switching circuit. In addition, the switching circuit may include DC blocking capacitors. The DC blocking capacitors prevent the DC voltage, supplied to turn ON and OFF the switching circuit, from being received at the voltage divider and/or the signal processing circuitry. The DC blocking capacitors can (i) negatively affect measurement accuracy due to associated signal disturbances, and (ii) increase complexity of calibration.

The following examples provide VCIs and corresponding voltage sensors that passively operate without need of a DC bias voltage while providing multiple channels for detecting RF voltages in respective voltage ranges. The VCIs and/or voltage sensors have a large dynamic range and high accuracy for each channel and/or voltage range monitored. This includes high accuracy at low RF voltages.

Figure 1:
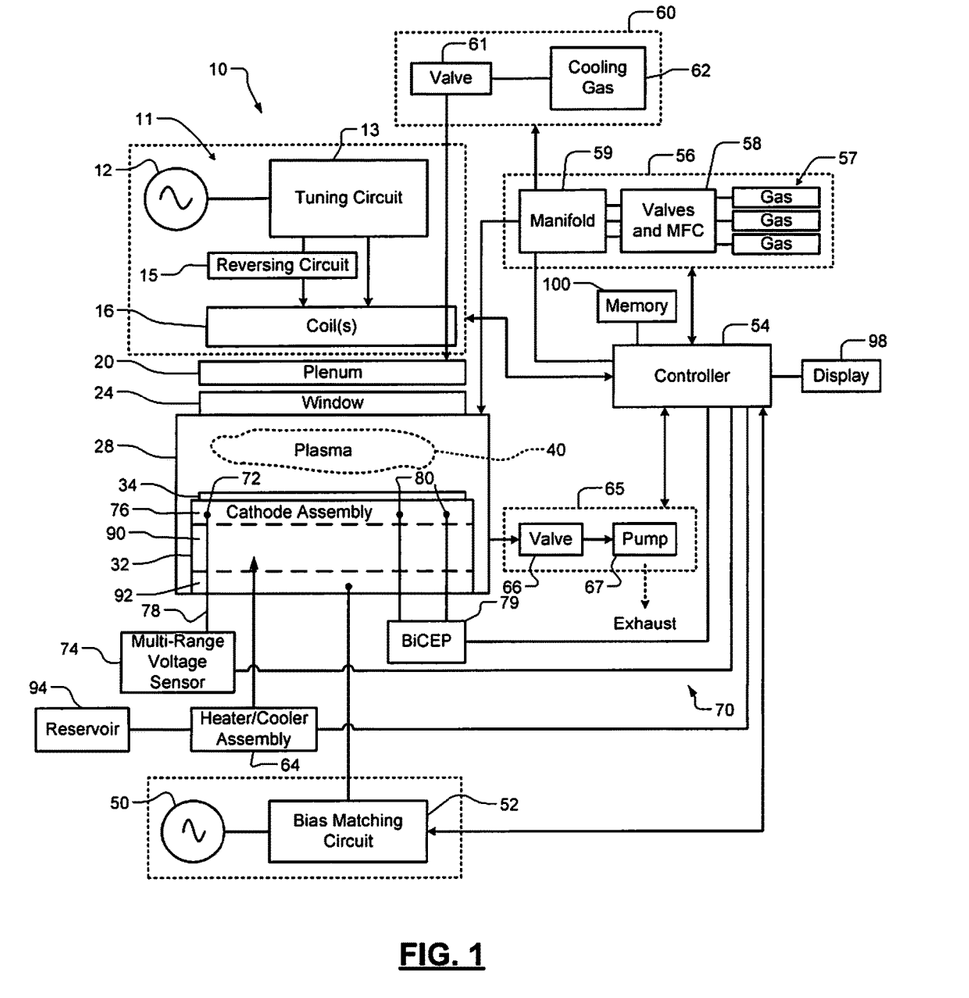
FIG. 1 is a functional block diagram of a substrate processing system incorporating a multi-range voltage sensor in accordance with the present disclosure.

FIG. 1 shows a substrate processing system 10 according to the present disclosure. The substrate processing system 10 may be a conductive etch processing system. The substrate processing system 10 includes a coil driving circuit 11. In some examples, the coil driving circuit 11 includes an RF source 12 and a tuning circuit 13. The tuning circuit 13 may be directly connected to one or more coils 16 or connected by a coil reversing circuit 15 to one or more coils 16. The tuning circuit 13 is used to tune an output of the RF source 12 to a predetermined frequency and/or a predetermined phase. The coil reversing circuit 15 is used to selectively switch the polarity of current through one or more of the coils 16.

In some examples, a gas plenum 20 may be arranged between the coils 16 and a window 24. The window 24 is arranged along one side of a processing chamber 28. The processing chamber 28 further comprises a substrate support structure 32 (sometimes referred to as a pedestal). The substrate support structure 32 may include an electrostatic chuck, a mechanical chuck or other type of chuck. Process gas is supplied to the processing chamber 28 and plasma 40 is generated inside of the processing chamber 28. The plasma 40 etches an exposed surface of the substrate 34. An RF source 50 and a bias matching circuit 52 may be used to bias the substrate support structure 32 during operation.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas delivery system 60 may be used to deliver gas 62 via a valve 61 to the gas plenum 20. The gas may include cooling gas that is used to cool the coils 16 and the window 24. A heater/cooler assembly 64 may be used to heat the substrate support structure 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, supply of cooling gas, etc.

The substrate processing system 10 may further include a VCI 70. The VCI 70 may include a pickup device 72, a multi-range voltage sensor 74 (referred to hereinafter as "the voltage sensor"), the controller 54 and any circuitry between the voltage sensor 74 and the controller 54. The pickup device 72 extends into the substrate support structure 32 and may be located in a cathode assembly 76 of the substrate support structure 32. The pickup device 72 is connected via a wire 78 to the voltage sensor 74 and is used to generate a RF voltage signal. The voltage sensor 74 is configured to detect peak voltages in the RF voltage signal for multiple voltage ranges. The voltage sensor 74 has multiple channels. The channels are allocated to corresponding ranges of input voltages received from the pickup device 72. Each of the channels may provide a linear output response for at least a portion of a corresponding input voltage range.

The voltage sensor 74 generates output signals, which may be monitored and/or used to adjust a biasing RF signal generated by a bias compensation end point (BiCEP) circuit 79. The BiCEP circuit 79 includes and/or is implemented as a bipolar high voltage DC supply that provides clamping DC voltages to electrodes 80 in the cathode assembly 76 of the substrate support structure 32. The BiCEP circuit 79 may be controlled by the controller 54 based on RF voltages detected by the voltage sensor 74. The bias matching circuit 52 may supply a bias voltage to the metal base 92 based on the RF voltages detected by the voltage sensor 74.

The substrate support structure 32 may further include a thermal energy control assembly (TECA) 90 and a metal base 92. The heater/cooler assembly 64 may circulate a coolant between the TECA 90 and a reservoir 94 and be used in controlling temperature of the substrate support structure 32.

Operation of the voltage sensor 74 may be monitored via the controller 54. The controller 54 may display output voltages of the channels of the voltage sensor 74 on a display 98. Although shown separate from the controller 54, the display 98 may be included in the controller 54. The controller 54 may receive input signals from the voltage sensor 74 and based on the input signals control operation of the bias matching circuit 52 and the BiCEP circuit 79. The voltage sensor 74 is further described below with respect to FIGS. 2-7.

The controller 54 may adjust a bias RF signal generated by the bias matching circuit 52 and/or the BiCEP circuit 79 to change an amount of DC bias and/or a DC sheath potential at the substrate 34. The controller 54 may compare outputs of the channels of the voltage sensor 74 and/or a representative value derived based on the outputs of the channels to one or more set point values. The set point values may be predetermined and stored in a memory 100 accessible to and/or included in the controller 54. The bias RF signal may be adjusted based on differences between (i) outputs of the voltage sensor 74 and/or the representative value and (ii) the one more set point values. The bias RF signal may pass through the bias matching circuit 52. An output provided by the bias matching circuit 52 (referred to as a matched signal) is then passed to the substrate support structure 32.

Figure 2:
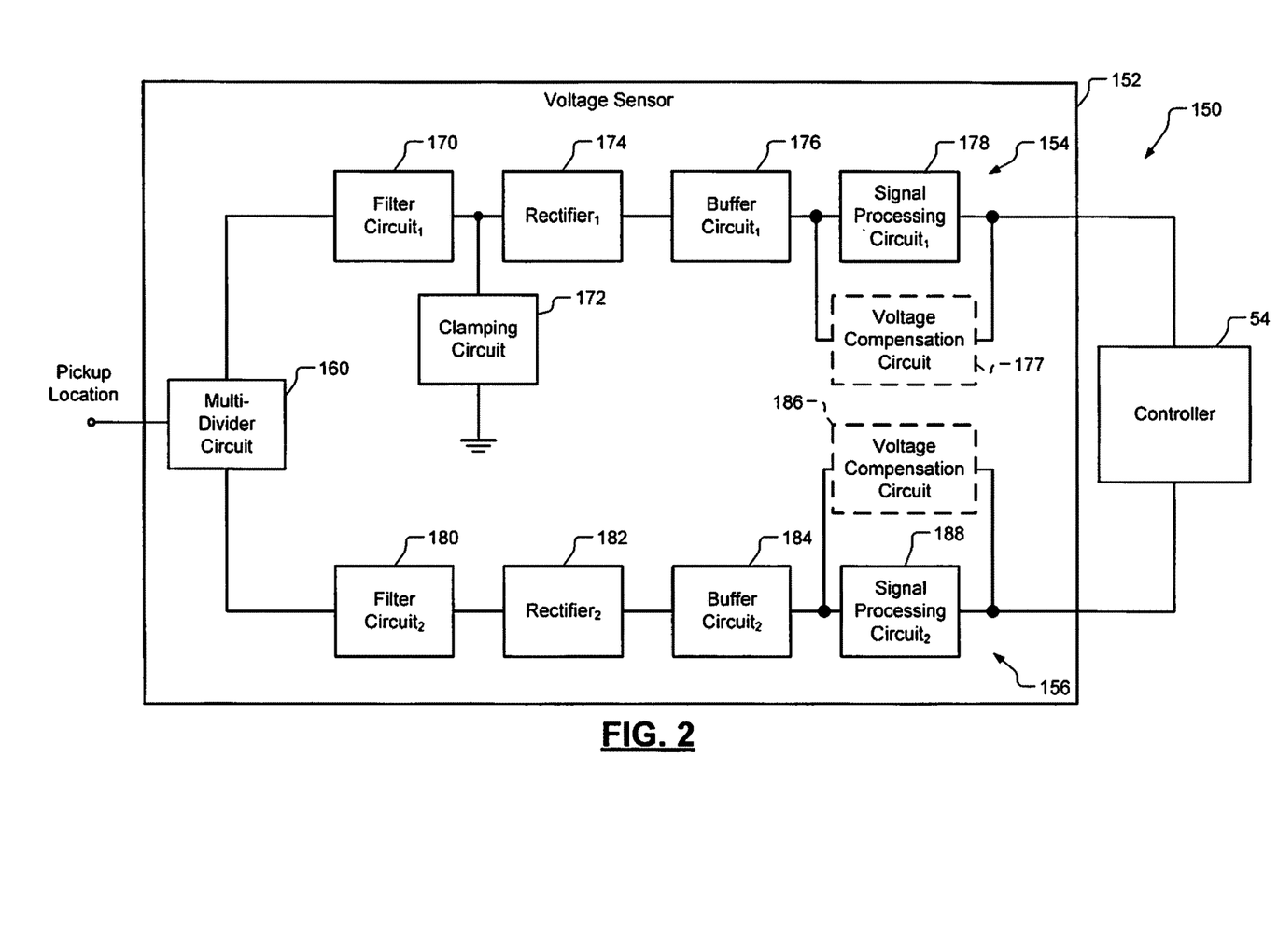
FIG. 2 is a functional block diagram of a voltage control interface in accordance with the present disclosure.

FIG. 2 shows a VCI 150 that includes a multi-range voltage sensor 152 (referred to hereinafter as "the voltage sensor") and the controller 54, which operates in a bias RF voltage control mode. The bias RF voltage control mode includes adjusting the bias RF voltage supplied to the cathode assembly 76 of FIG. 1 based on RF voltages and/or peak RF voltages detected by the voltage sensor 152. The voltage sensor 152 may be used in the substrate processing system 10 of FIG. 1 and/or replace the voltage sensor 74. The voltage sensor 152 includes multiple channels 154, 156. Although two channels are shown, the voltage sensor 152 may include any number of channels. The controller 54 may monitor one or more of the channels for each voltage range. Adjacent ones of the voltage ranges corresponding to the channels may overlap to provide a large continuous overall range (e.g., 0-2500V) over which voltages are monitored by the controller 54.

Figure 4:
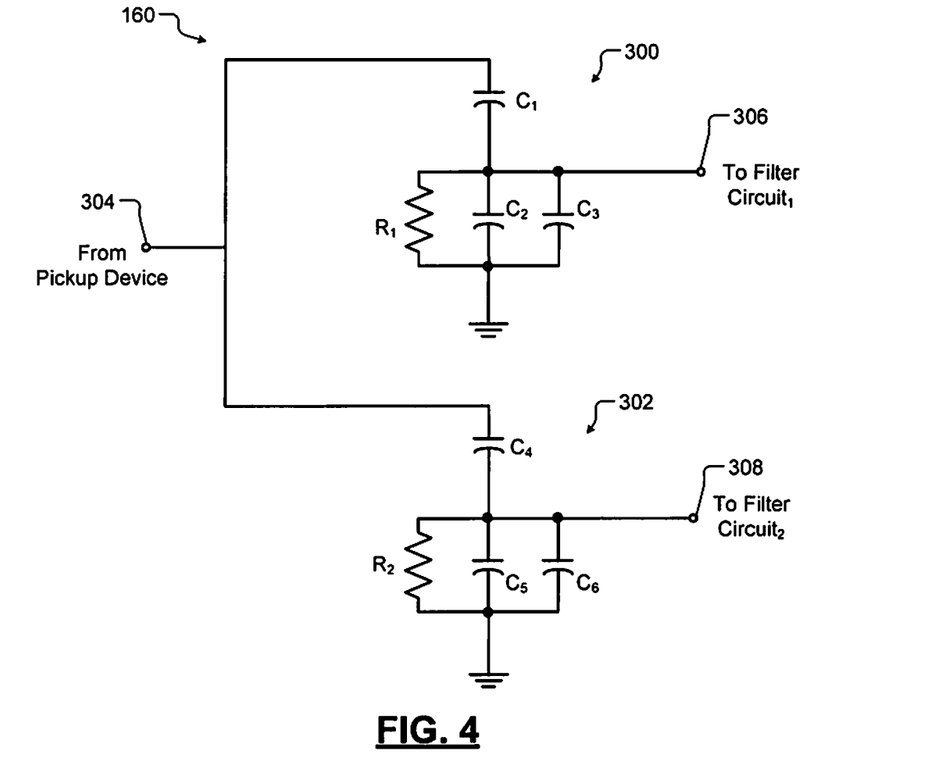
FIG. 4 is a schematic diagram of a voltage divider circuit in accordance with the present disclosure.

The voltage sensor 152 includes a multi-divider circuit 160 and the channels 154, 156. The multi-divider circuit 160 receives a RF voltage from the pickup device 72 of FIG. 1. An example of the multi-divider circuit 160 is shown in FIG. 4. The multi-divider circuit 160 includes multiple voltage dividers and provides reduced voltages to the channels 154, 156 based on the RF voltage from the pickup device 72.

The first channel 154 includes a first filter circuit 170, a clamping circuit 172, a first rectifier 174, a first buffer circuit 176, and a first signal processing circuit 178. The first channel 154 may include a voltage compensation and/or blocking circuit (hereinafter "voltage compensation circuit") 177. The second channel 156 includes a second filter circuit 180, a second rectifier 182, a second buffer circuit 184, and a second signal processing circuit 188. The second channel 156 may include a voltage compensation and/or blocking circuit (hereinafter "voltage compensation circuit") 186. Although two voltage compensation circuits 177, 186 are shown, the voltage compensation circuits 177, 186 may be combined into a single voltage compensation circuit. The voltage compensation circuits 177, 186 may be connected in parallel with respectively the signal processing circuits 178, 188. Operation of the voltage sensor 152 and the corresponding channels 154, 156 are further described with respect to the method of FIG. 3. The channels 154, 156 and/or any other included channels operate independently of each other without need of an external control signal and/or determinations of actual measured RF voltage magnitudes and/or set point values included in substrate processing recipes.

Figure 3:
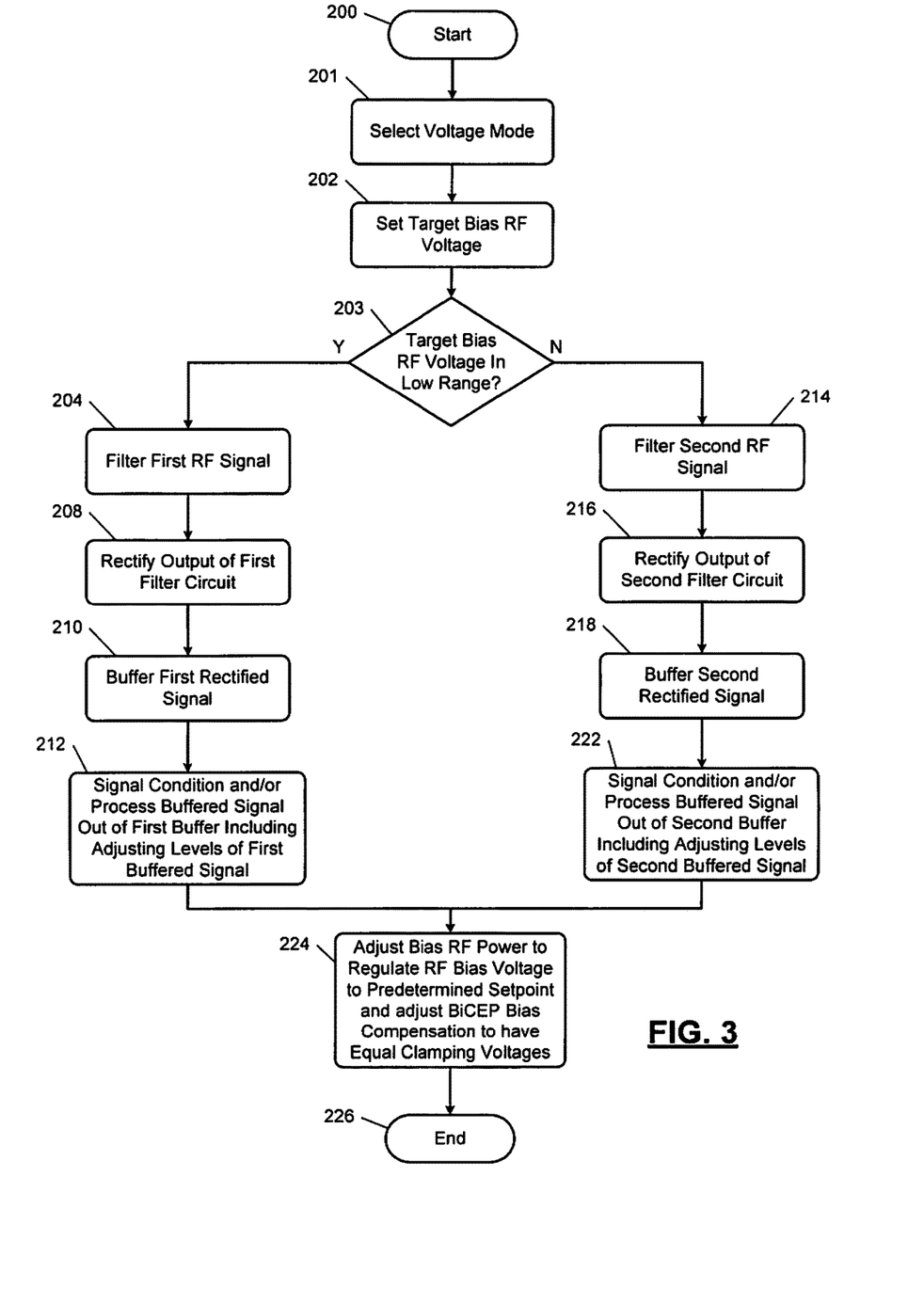
FIG. 3 illustrates a method of operating substrate processing system and a voltage control interface in accordance with the present disclosure.

The VCIs disclosed herein may be operated using numerous methods, an example method is illustrated in FIG. 3. In FIG. 3, a method of operating a substrate processing system including a VCI is shown. Although the following tasks are primarily described with respect to the implementations of FIGS. 1-2 and 4-7, the tasks may be easily modified to apply to other implementations of the present disclosure. The tasks may be iteratively performed.

The method may begin at 200. At 201, the controller 54 may select an operating or voltage mode, which may include operating in a bias RF voltage control mode, a low voltage mode, a high voltage mode, a multi-range voltage mode, or other RF voltage mode. The low voltage mode may refer to providing and/or detecting voltages within a low (or first predetermined) range. The high voltage mode may refer to providing and/or detecting voltages within a high (or second predetermined) range. The multi-range voltage mode may refer to providing and/or detecting voltages within multiple ranges, which may include the low range and the high range. Adjacent ones of the multiple ranges may overlap each other as described above.

At 202, the controller 54, based on the operating mode, controls operation of the bias matching circuit 52 and the BiCEP circuit 79 to control voltages provided to electrodes 80 and the metallic base 92 of the substrate support structure 32. The controller 54 may set a target bias RF voltage for the BiCEP circuit 79. The multi-divider circuit 160 receives a RF voltage from the pickup device 72 and outputs respective voltage signals to two or more channels (e.g., the channels 154, 156). An example of the multi-divider circuit 160 is shown in FIG. 4.

Figure 5:
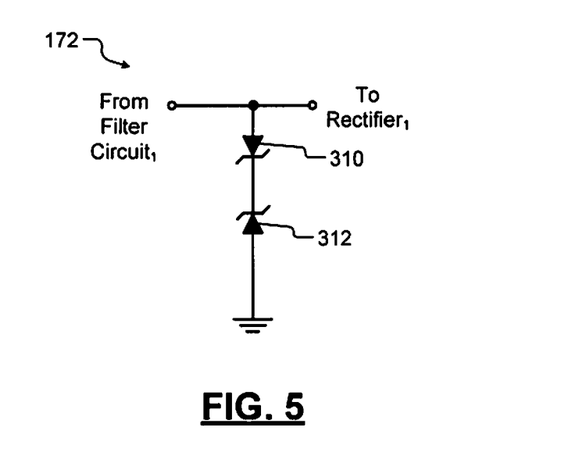
FIG. 5 is a schematic diagram of a voltage clamping circuit in accordance with the present disclosure.

At 203, if the target bias RF voltage is in the low range task 204 is performed, otherwise the target bias RF voltage is in the high range and task 214 is performed. At 204, the first filter circuit 170 receives and filters the first voltage signal received from the multi-divider circuit 160. The clamping circuit 172 clamps voltages out of the first filter circuit 170 and/or the multi-divider circuit 160. As an example, if an overall voltage range of the VCI is 2500V and the channels 154, 156 are configured to detect voltages in respective ranges 0-1500V and 1000-2500V, then the clamping circuit 172 may clamp the output of the first filter circuit 170 and/or the multi-divider circuit 160 to a reduced voltage corresponding to 1500V or other predetermined maximum voltage of the low voltage range. The clamping may occur when (i) the received RF voltage is greater than a second predetermined voltage, or (ii) the reduced voltage is greater than a third predetermined voltage. The predetermined maximum voltage may be equal to the third predetermined voltage. The second predetermined voltage is greater than the predetermined maximum voltage and the third predetermined voltage. Components of the clamping circuit 172 are preselected to clamp the output of the first filter circuit 170 and/or the multi-divider circuit 160 to the predetermined maximum voltage. An example of the clamping circuit 172 is shown in FIG. 5.

At 208, the first rectifier 174 rectifies an output of the first filter circuit 170 from a first alternating current (AC) signal to a first DC signal. At 210, the first buffer circuit 176 buffers the first DC signal (or the first rectified signal). The first buffer circuit 176 may include and/or be implemented as a unity gain buffer.

At 212, the first signal processing circuit 178 signal conditions and/or processes an output of the first buffer circuit 176. This may include filtering, amplifying and/or adjusting levels of the output of the first buffer circuit 176. As an example, the output of the first signal processing circuit 178 may be a voltage within a predetermined range (e.g., 0-10V), which is based on the RF voltage received at the pickup device 72. The output voltage of the first signal processing circuit 178 may be proportional to and/or directly related to the RF voltage received.

Figure 7:
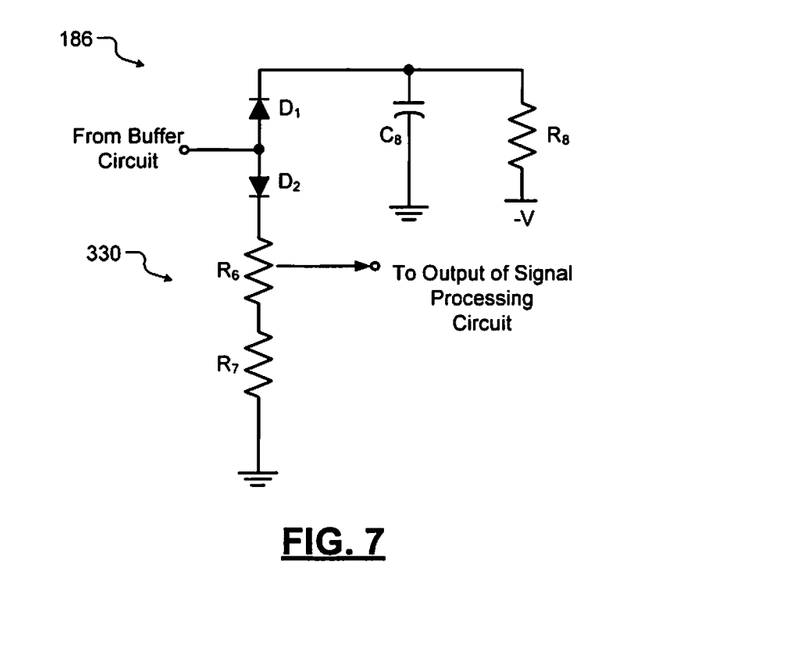
FIG. 7 is a schematic diagram of a voltage compensation circuit in accordance with the present disclosure.

Although not shown in FIG. 3, the voltage compensation circuit 177 may receive the output of the first buffer circuit 176 and adjust output of the first signal processing circuit 178 to adjust the DC bias with respect to ground. This balances clamping voltages on the electrodes 80. An example of the voltage compensation circuit is shown in FIG. 7. In one embodiment, voltage compensation may not be performed to the output of the first signal processing circuit 178.

At 214, the second filter circuit 180 receives and filters the second voltage signal received from the multi-divider circuit 160. As shown, the output of the second filter circuit 180 is not clamped as the output of the first filter circuit 170. This is because the second channel 156 may be used to monitor the voltage range above and/or higher than the voltage range monitored using the first channel 154.

Figure 6:
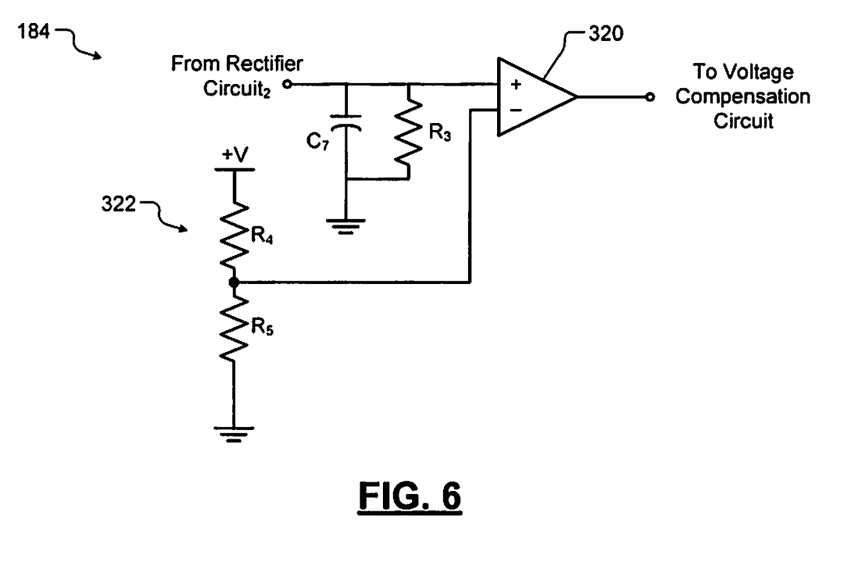
FIG. 6 is a schematic diagram of a buffer circuit in accordance with the present disclosure.

At 216, the second rectifier 182 rectifies an output of the second filter circuit 180 from a second alternating current (AC) signal to a second DC signal. At 218, the second buffer circuit 184 buffers the second DC signal. An example of the second buffer circuit 184 is shown in FIG. 6.

At 222, the second signal processing circuit 188 signal conditions and/or processes an output of the voltage compensation circuit 186. This may include filtering, amplifying and/or adjusting levels of the output of the voltage compensation circuit 186. As an example, the output of the second signal processing circuit 188 may be a voltage within a predetermined range (e.g., 0-10V), which is based on the RF voltage received at the pickup device 72. The predetermined range of the second signal processing circuit 188 may be the same or different than the predetermined range of the first signal processing circuit 178. The output voltage of the second signal processing circuit 188 may be proportional to and/or directly related to the RF voltage received.

Although not shown in FIG. 3, the voltage compensation circuit 186 may receive the output of the second buffer circuit 184 and adjust output of the second signal processing circuit 188 to adjust the DC bias with respect to ground. This balances clamping voltages on the electrodes 80. An example of the voltage compensation circuit is shown in FIG. 7. In one embodiment, voltage compensation may not be performed to the output of the second signal processing circuit 188.

At 224, the controller 54 may adjust the voltages provided by the BiCEP circuit 79 and the bias matching circuit 52 to the substrate support structure 32. The voltages may be adjusted based on the outputs of the signal processing circuits 178, 188. This may include adjusting RF bias power to regulate the RF bias voltage to a predetermined setpoint. The controller 54 may adjust the set point values described above based on the outputs of the signal processing circuits 178, 188 and/or the voltage compensation circuits 177, 186. The outputs of the signal processing circuits 178, 188 and/or the voltage compensation circuits 177, 186 may be provided directly to the BiCEP circuit 79. The outputs of the signal processing circuits 178, 188 may be used to offset one or more voltages of the BiCEP circuit 79 to equalize clamping voltages of the substrate support structure 32. This may be referred to as adjusting BiCEP bias compensation to provide equal clamping voltages. Each of these adjustments and offsets may be based on the first and/or second outputs of the signal processing circuits 178, 188 when the received RF voltage is in the low voltage range. Each of these adjustments and offsets may be based on the first and/or second outputs of the signal processing circuits 178, 188 when the received RF voltage is in the high voltage range. In one embodiment, adjustments and offsets are based on (i) the first output of the first signal processing circuit 178 and not the second output of the second signal, processing circuit 188 when the received RF voltage is in the low voltage range, and (ii) the second output of the second signal processing circuit 188 and not the first output of the first signal processing circuit 178 when the received RF voltage is in the high voltage range. Subsequent to task 224, the method may end at 226 as shown or task 202 may be performed.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

FIG. 4 shows an example of the multi-divider circuit 160, which includes a first voltage divider 300 and a second voltage divider 302. The first voltage divider 300 may include a first capacitance $C_1$, a second capacitance $C_2$, a third capacitance $C_3$ and a first resistance $R_1$. The first capacitance $C_1$ is connected in series between (i) an input terminal 304 and (ii) the capacitances $C_2$, $C_3$ and the first resistance $R_1$. The capacitances $C_2$, $C_3$ and the first resistance $R_1$ are connected in parallel between the first capacitance $C_1$ and a ground reference. An output terminal 306 is connected to an output of the first capacitance $C_1$ and to inputs of the capacitances $C_2$, $C_3$ and the first resistance $R_1$.

The second voltage divider 302 may include a fourth capacitance $C_4$, a fifth capacitance $C_5$, a sixth capacitance $C_6$ and a second resistance $R_2$. The fourth capacitance $C_4$ is connected in series between (i) the input terminal 304 and (ii) the capacitances $C_5$, $C_6$ and the second resistance $R_2$. The capacitances $C_5$, $C_6$ and the second resistance $R_2$ are connected in parallel between the fourth capacitance $C_4$ and a ground reference. An output terminal 308 is connected to an output of the fourth capacitance $C_4$ and to inputs of the capacitances $C_5$, $C_6$ and the second resistance $R_2$.

The first voltage divider 300 may have a first impedance ratio. The second voltage divider circuit 302 may have a second impedance ratio. The second impedance ratio may be the same or different than the first impedance ratio.

FIG. 5 shows an example of the voltage clamping circuit 172 which may include a first zener diode 310 and a second zener diode 312. The zener diodes 310, 312 are connected in series between (i) an output of the first filter circuit 170 and (ii) the ground reference. The zener diodes 310, 312 are also connected in series between (i) an input of the first rectifier 174 and (ii) the ground reference. Cathode ends of the zener diodes 310, 312 may be directly connected to each other. The zener diodes 310, 312 provide protection against high voltages or voltages greater than a predetermined voltage. The zener diodes 310, 312 are placed in shunt to an input of the corresponding first channel 154. As a result, the zener diodes 310, 312 automatically clip the RF voltage at the input to the first channel 154 to a safe level to protect components of the first channel 154 during high bias RF voltage operation.

FIG. 6 shows an example of the second buffer circuit 184, which may include an operational amplifier 320, a capacitance $C_7$, a resistance $R_3$ and a voltage divider 322. The capacitance $C_7$ and resistance $R_3$ are connected in parallel between (i) the second rectifier circuit 182 and a non-inverting input of the operational amplifier 320 and (ii) the ground reference. The voltage divider 322 may include resistances $R_4$, $R_5$ connected in series between a voltage source and the ground reference. An output of the voltage divider 322 is provided to an inverting input of the operational amplifier 320. The voltage divider 322 may be used to offset the voltage provided to the non-inverting input of the operational amplifier 320.

The operational amplifier 320 compares a voltage at the non-inverting input to the voltage at the inverting input. If the voltage at the non-inverting input is greater than or equal to the voltage at the inverting input, then the output of the operational amplifier is greater than or equal to 0V. If the voltage at the non-inverting input is less than the voltage at the inverting input, then the output of the operational amplifier is less than 0V. An output of the operational amplifier 320 is provided to the voltage compensation circuit 186.

FIG. 7 shows an example of the voltage compensation circuit 186, which may include: diodes $D_1$, $D_2$; a voltage divider 330 including resistances $R_6$, $R_7$; capacitance $C_8$; and resistance $R_8$. The diodes $D_1$, $D_2$ and the resistances $R_6$, $R_7$ are connected in series between (i) the capacitance $C_8$ and the resistance $R_8$ and (ii) the ground reference. Anodes of the diodes $D_1$, $D_2$ are connected to each other and to an output of the second buffer circuit 184. The voltage divider is connected between the diode $D_2$ and the ground reference. The capacitance $C_8$ is connected (i) between diode $D_1$ and the ground reference and (ii) to one end of the resistance $R_8$. A signal tap off of the resistance $R_6$ is provided and connected to the second signal processing circuit 188. The resistance $R_6$ may be a variable resistance with the signal tap at a predetermined position.

The above-described voltage sensors provide a large dynamic range and high accuracy from end to end in a full scale for VCI applications. The VCI applications may include conductor etch processing systems and/or other suitable processing systems where a VCI is used to facilitate a bias RF voltage control mode. The examples enable high measurement accuracy at both low and high ends of an overall RF voltage range without overloading occurring at high RF voltages and/or reduction in measurement accuracy due to poor signal-to-noise (SNR) levels at low RF voltages. The examples provide more robust and less complex VCIs with large dynamic range and high accuracy using a dual or multiple voltage divider and dual or multiple channels with a clamping circuit for self-protection of the one or more channels configured for low voltage ranges and receiving high voltages. This protection is provided without need for external control of a switching circuit.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A voltage sensor of a substrate processing system, the voltage sensor comprising:
    a multi-divider circuit configured to receive a radio frequency (RF) signal, wherein the received RF signal is indicative of a RF voltage provided at a substrate in a plasma chamber of the substrate processing system, wherein the multi-divider circuit comprises a first divider and a second divider, wherein the first divider corresponds to a first channel and is configured to (i) receive the RF signal from an electrode, and (ii) output a first reduced voltage based on the received RF signal, wherein the second divider corresponds to a second channel and is configured to (i) receive the RF signal from the electrode, and (ii) output a second reduced voltage based on the received RF signal, and wherein the first reduced voltage and the second reduced voltage are less than the RF voltage;
    a clamping circuit configured to clamp the first reduced voltage to a first predetermined voltage when (i) the RF voltage is greater than a second predetermined voltage, or (ii) the first reduced voltage is greater than a third predetermined voltage;
    a first output of the first channel configured to output a first output signal based on the first reduced voltage and while the received RF signal is in at least one of a first voltage range or a second voltage range, wherein the second voltage range is higher than the first voltage range, and wherein the first predetermined voltage is based on a maximum value of the first voltage range; and
    a second output of the second channel configured to output a second output signal based on the second reduced voltage and while the received RF signal is in the at least one of the first voltage range or the second voltage range.

2. The voltage sensor of claim 1, wherein:
the first divider comprises a first capacitance connected in series with a second capacitance; and
the second divider comprises a third capacitance connected in series with a fourth capacitance.

3. The voltage sensor of claim 2, wherein:
the first divider comprises a fifth capacitance and a first resistance connected in parallel with the second capacitance; and
the second divider comprises a sixth capacitance and a second resistance connected in parallel with the fourth capacitance.

4. The voltage sensor of claim 1, wherein the clamping circuit comprises a pair of zener diodes.

5. The voltage sensor of claim 1, wherein:
the first predetermined voltage is equal to the third predetermined voltage; and
the second predetermined voltage is greater than the first predetermined voltage and the third predetermined voltage.

6. The voltage sensor of claim 1, wherein:
the second channel comprises a buffer circuit;
the buffer circuit comprises an amplifier and a voltage divider;
the amplifier receives a first input and a second input;
the first input is generated based on the second reduced voltage;
the second input is generated based on an output of the voltage divider; and
the second output signal is generated based on an output of the amplifier.

7. The voltage sensor of claim 6, wherein the second channel further comprises a voltage circuit configured to block voltages out of the amplifier that are less than a fourth predetermined voltage.

8. The voltage sensor of claim 7, wherein:
the voltage circuit comprises a pair of diodes; and
the fourth predetermined voltage is 0V.

9. The voltage sensor of claim 1, wherein:
the first channel comprises a first rectifier;
the second channel comprises a second rectifier;
the first rectifier generates a first rectified signal based on the first reduced voltage; and
the second rectifier generates a second rectified signal based on the second reduced voltage.

10. The voltage sensor of claim 9, wherein:
the first channel comprises a first buffer circuit;
the second channel comprises a second buffer circuit;
the first buffer circuit buffers the first rectified signal; and
the second buffer circuit buffers the second rectified signal.

11. A voltage controlled interface comprising:
the voltage sensor of claim 1; and
a controller configured to control a bias voltage supplied to a substrate support structure in the plasma chamber based on (i) the first output signal while the received RF signal is in the first voltage range, and (ii) the second output signal while the received RF signal is in the second voltage range.

12. A substrate processing system comprising:
the voltage controlled interface of claim 11;
the plasma chamber;
a pickup device configured to receive the RF voltage and generate the RF signal;
a chuck disposed in the plasma chamber, wherein the pickup device is connected to the chuck; and
a power source configured to supply the bias voltage to the chuck.

13. The voltage sensor of claim 1, wherein the clamping circuit clamps the first reduced voltage to the maximum value of the first voltage range.

14. The voltage sensor of claim 1, wherein:
an overall voltage range of the voltage sensor has a peak voltage;
the first voltage range is from zero to the maximum value;
the maximum value is less than the peak voltage; and
the second voltage range is from a voltage less than the maximum value to the peak voltage.

15. The voltage sensor of claim 14, wherein the peak voltage is greater than or equal to 1200V.

16. The voltage sensor of claim 1, wherein the maximum value is greater than a minimum voltage of the second voltage range and less than a maximum voltage of the second voltage range.

17. The voltage sensor of claim 1, wherein the clamping circuit comprises:
a first diode; and
a second diode connected in series with the first diode, wherein a cathode of the second diode is connected to a cathode of the first diode.

18. The voltage sensor of claim 1, wherein the second reduced voltage is not clamped by a clamping circuit.

19. The voltage sensor of claim 1, wherein the second reduced voltage is not clamped by the clamping circuit.

20. A voltage controlled interface comprising:
the voltage sensor of claim 1; and
a controller configured to select a bias voltage to supply to a substrate support structure in the plasma chamber and determine whether to monitor either the first channel or the second channel based on the selected bias voltage,
wherein
the controller monitors the first channel while the bias voltage is in the first voltage range,
the first output signal represents the RF signal in the first voltage range,
the controller monitors the second channel while the bias voltage is in the second voltage range, and
the second output signal represents the RF signal in the second voltage range.

* * * * *